(12) United States Patent
Liu

(10) Patent No.: US 11,869,931 B2
(45) Date of Patent: Jan. 9, 2024

(54) SEMICONDUCTOR STRUCTURE AND METHOD OF FORMING THE SAME

(71) Applicant: CHANGXIN MEMORY TECHNOLOGIES, INC., Hefei (CN)

(72) Inventor: Ang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 318 days.

(21) Appl. No.: 17/486,671

(22) Filed: Sep. 27, 2021

(65) Prior Publication Data

US 2022/0238640 A1  Jul. 28, 2022

Related U.S. Application Data

(63) Continuation of application No. PCT/CN2021/100517, filed on Jun. 17, 2021.

(30) Foreign Application Priority Data

Jan. 27, 2021 (CN) .......................... 202110110494.9

(51) Int. Cl.
*H10B 12/00* (2023.01)
*H01L 23/522* (2006.01)
(Continued)

(52) U.S. Cl.
CPC .............. *H01L 28/91* (2013.01); *H01L 28/92* (2013.01); *H10B 12/31* (2023.02)

(58) Field of Classification Search
CPC ......... H01L 28/40; H01L 28/60; H01L 28/86; H01L 28/87; H01L 28/88; H01L 28/90;
(Continued)

(56) References Cited

U.S. PATENT DOCUMENTS

2005/0253179 A1* 11/2005 Park ..................... H10B 12/033
257/E27.088
2007/0170487 A1* 7/2007 Heitmann ............... H01L 28/91
438/399
(Continued)

FOREIGN PATENT DOCUMENTS

CN  106711145 A  5/2017
CN  107093604 A  8/2017
(Continued)

OTHER PUBLICATIONS

First Office Action of the Chinese application No. 202110110494.9, dated May 25, 2022, 14 pages.
(Continued)

*Primary Examiner* — Omar F Mojaddedi
(74) *Attorney, Agent, or Firm* — Cooper Legal Group, LLC

(57) ABSTRACT

The present application relates to semiconductor structure and forming method comprising: forming substrate, wherein plurality of capacitive contacts are provided in the substrate, plurality of electrically conductive contact pads are provided at surface of the substrate to be correspondingly connected to plurality of capacitive contacts on one-to-one basis, and a space is present between every two adjacent electrically conductive contact pads; forming filling layer that is fully filled in the space; forming stacked structure at the filling layer and surface of the electrically conductive contact pads, wherein the stacked structure includes plurality of supporting layers stacked one-on-another along direction perpendicular to the substrate, the filling layer is in contact with the supporting layer disposed at bottom of the stacked structure, and etching selection ratio between the filling layer and the supporting layer in contact therewith is greater than preset (Continued)

value; and etching the stacked structure to form capacitance hole.

15 Claims, 4 Drawing Sheets

(51) Int. Cl.
 *H01L 23/528* (2006.01)
 *H01L 49/02* (2006.01)
(58) Field of Classification Search
 CPC ..... H01L 28/91; H01L 28/92; H01L 23/5223; H01L 23/528; H01L 23/5222; H10B 12/00; H10B 12/033; H10B 12/03; H10B 12/30
 See application file for complete search history.

(56) References Cited

U.S. PATENT DOCUMENTS

| | | | |
|---|---|---|---|
| 2011/0294276 A1* | 12/2011 | Kuroki | H10B 12/033 257/E21.09 |
| 2015/0221718 A1* | 8/2015 | Rhie | H10B 12/318 438/386 |
| 2017/0345886 A1 | 11/2017 | Yi et al. | |
| 2018/0026040 A1 | 1/2018 | Hong et al. | |
| 2018/0166320 A1* | 6/2018 | Kim | H01L 28/90 |
| 2019/0198506 A1* | 6/2019 | Kim | H10B 12/053 |
| 2020/0219880 A1* | 7/2020 | Kim | H01L 28/90 |

FOREIGN PATENT DOCUMENTS

| | | |
|---|---|---|
| CN | 107301976 A | 10/2017 |
| CN | 107910327 A | 4/2018 |
| CN | 108269789 A | 7/2018 |
| CN | 108447864 A | 8/2018 |
| CN | 108511440 A | 9/2018 |
| CN | 110010604 A | 7/2019 |
| CN | 110690346 A | 1/2020 |
| CN | 111326654 A | 6/2020 |
| CN | 111354727 A | 6/2020 |
| CN | 112908936 A | 6/2021 |
| JP | 2008283026 A | 11/2008 |
| JP | 2011249583 A | 12/2011 |
| JP | 2015053337 A | 3/2015 |
| KR | 20040072964 A | 8/2004 |
| KR | 20100073094 A | 7/2010 |

OTHER PUBLICATIONS

Notice of Allowance of the Chinese application No. 202110110494.9, dated Jan. 4, 2023, 4 pages.
"Thin Film Transistor (TFT) Array", Valley manufacturing technology of China, Sep. 2007, 8 pages.
International Search Report as cited in PCT/CN2021/100517 dated Oct. 28, 2021, 9 pages.

* cited by examiner

SEMICONDUCTOR STRUCTURE AND METHOD OF FORMING THE SAME

CROSS-REFERENCE TO RELATED APPLICATIONS

The present application is a continuation application of International Patent Application No. PCT/CN2021/100517, filed on Jun. 17, 2021, which claims the right of priority of the Chinese Patent Application No. 202110110494.9, filed on Jan. 27, 2021 and entitled "Semiconductor Structure and Method of Forming the Same". The entire contents of International Patent Application No. PCT/CN2021/100517 and Chinese Patent Application No. 202110110494.9 are herein incorporated by reference.

TECHNICAL FIELD

The present application relates to the technical field of semiconductor fabrication, and more particularly to a semiconductor structure and its forming method.

BACKGROUND

The dynamic random access memory (DRAM) is a semiconductor structure frequently used in such electronic devices as computers, it consists of a plurality of storage cells, each of which usually includes transistors and capacitors. The gate electrode of a transistor is electrically connected to wordlines, the source electrode is electrically connected to bitlines, and the drain electrode is electrically connected to the capacitor; wordline voltage on the wordlines controls on/off of the transistor, whereby it is possible to read data information stored in the capacitor through the bitlines, or to write data information in the capacitor.

In the current processing technique, over-etching tends to occur at the location where capacitance contacts the connection pad, and to form through holes in the substrate. During the process of forming capacitance column structure, the dielectric layer formed by a material having high dielectric constant has an adhesion property weaker than adhesion properties of upper and lower electrodes formed by electrically conductive materials, so that, once through holes are formed, the dielectric layer cannot be completely adhered onto the upper and lower electrodes of the capacitance column, and this causes the upper and lower electrodes to directly contact each other, whereby is engendered the problem of short circuit between the upper electrode and the lower electrode, performance of the memory is finally affected, and the memory might even be entirely discarded.

Accordingly, it is a technical problem to be urgently solved at present as how to avoid the problem of short circuit between the upper electrode and the lower electrode in the memory, to improve electrical property of the memory and to enhance fabrication acceptance rate of the memory.

SUMMARY

The present application provides a semiconductor structure and its forming method, so as to solve the current problem of short circuit tending to occur between the upper electrode and the lower electrode in the memory, to thereby improve electrical property of the memory and to enhance fabrication acceptance rate of the memory.

According to multiple embodiments, the first aspect of the present application provides a method of forming a semiconductor structure, and the method comprises: forming a substrate, wherein a plurality of capacitive contacts are provided in the substrate, a plurality of electrically conductive contact pads are provided at the surface of the substrate to be correspondingly connected to a plurality of capacitive contacts on a one to one basis, and a space is present between every two adjacent electrically conductive contact pads; forming a filling layer that is fully filled in the space; forming a stacked structure at the filling layer and a surface of the electrically conductive contact pads, wherein the stacked structure includes a plurality of supporting layers stacked one on another along a direction perpendicular to the substrate, the filling layer is in contact with the one supporting layer disposed at a bottom of the stacked structure, and an etching selection ratio between the filling layer and the supporting layer in contact therewith is greater than a preset value; and etching the stacked structure to form a capacitance hole that runs through the stacked structure and exposes the electrically conductive contact pads.

According to multiple embodiments, the second aspect of the present application provides a semiconductor structure that comprises: a substrate, wherein a plurality of capacitive contacts are provided in the substrate, and a plurality of electrically conductive contact pads are provided at the surface of the substrate to be correspondingly connected to a plurality of capacitive contacts on a one to one basis; a filling layer, sandwiched between adjacent electrically conductive contact pads; a stacked structure, wherein the stacked structure includes a plurality of supporting layers stacked one on another along a direction perpendicular to the substrate, the filling layer is in contact with the one supporting layer disposed at a bottom of the stacked structure, and an etching selection ratio between the filling layer and the supporting layer in contact therewith is greater than a preset value; and a capacitance hole, running through the stacked structure and exposing the electrically conductive contact pads.

DESCRIPTION OF EMBODIMENTS

Specific embodiments of the semiconductor structure and its forming method as provided by the present application will be described in detail below with reference to the accompanying drawings.

Figure 1:
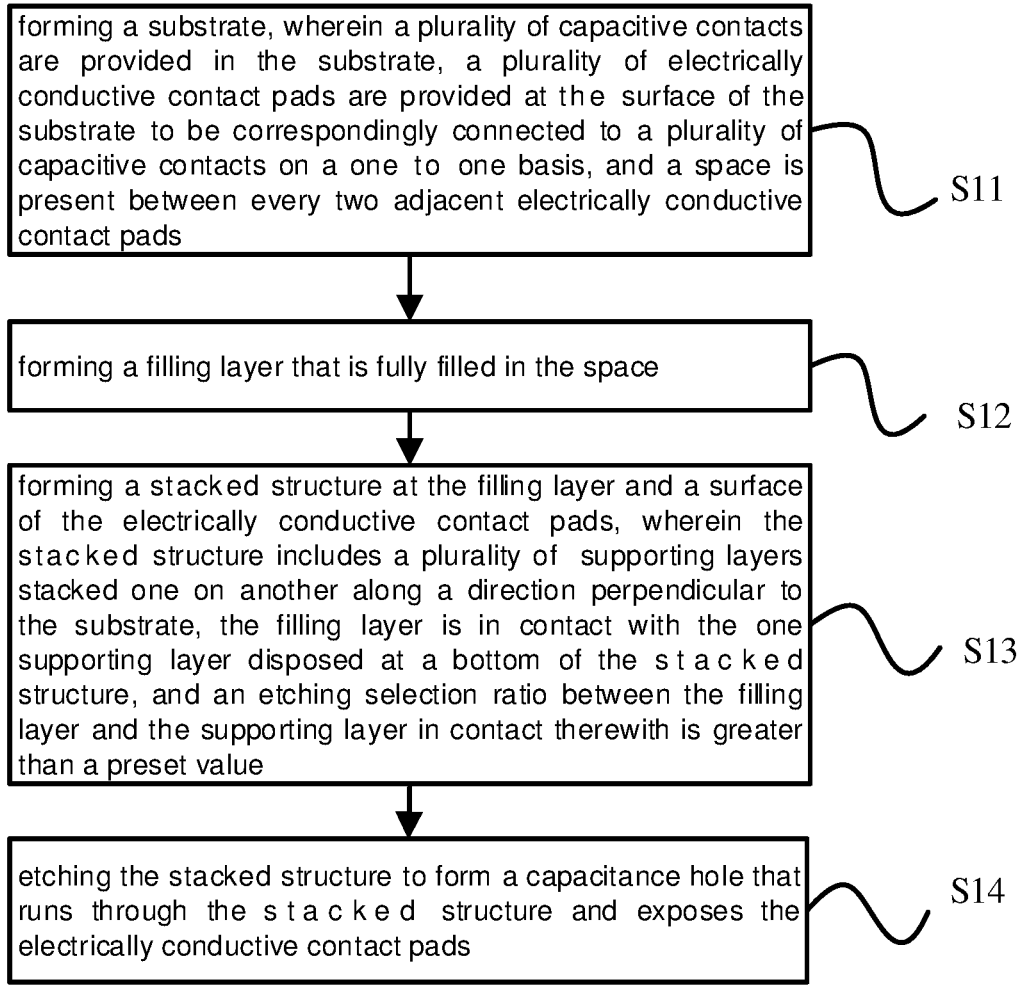
FIG. 1 is a flowchart illustrating the method of forming a semiconductor substrate in a specific embodiment of the present application.
Figure 2A:
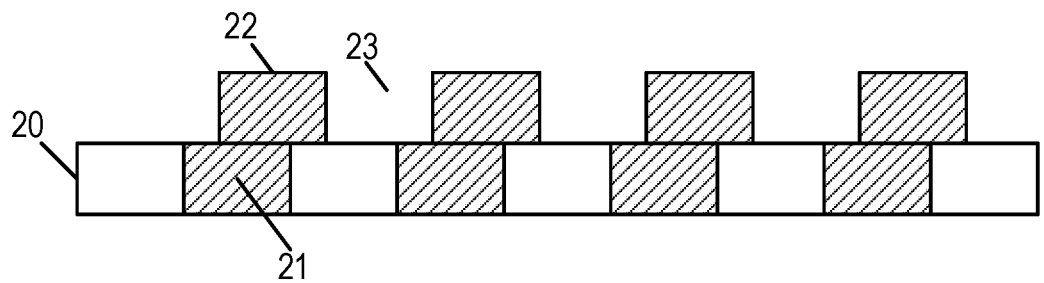
FIGS. 2A-2G are cross-sectional views illustrating the main processing techniques in the process of forming a semiconductor structure in specific embodiments of the present application.
Figure 2B:
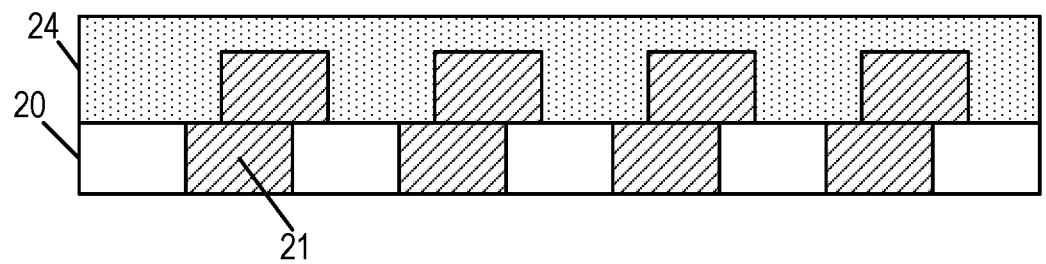
Figure 2C:
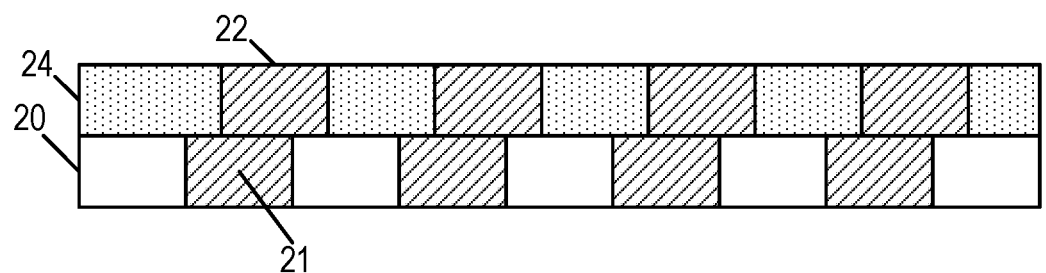
Figure 2D:
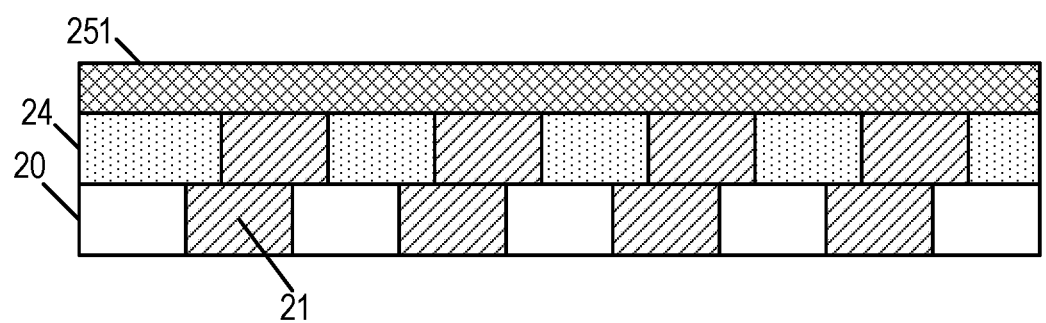
Figure 2E:
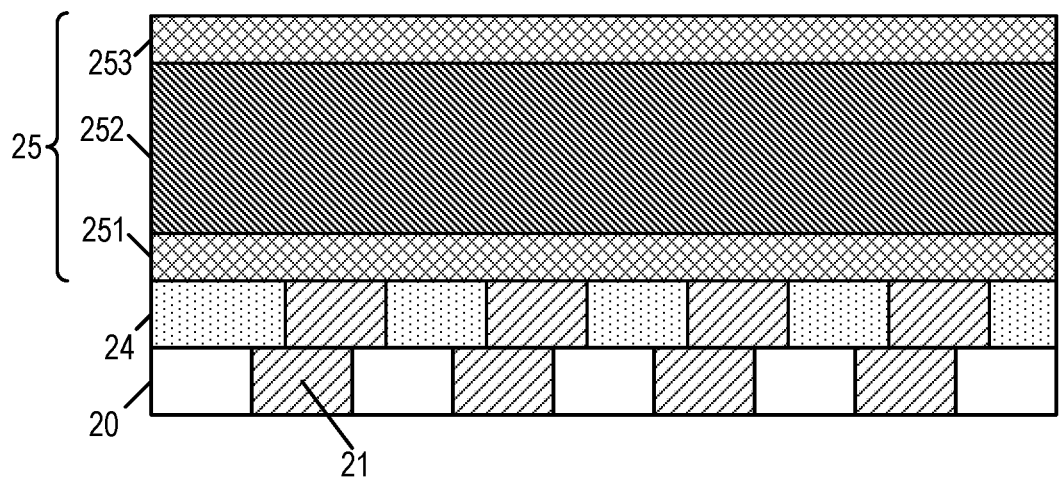
Figure 2F:
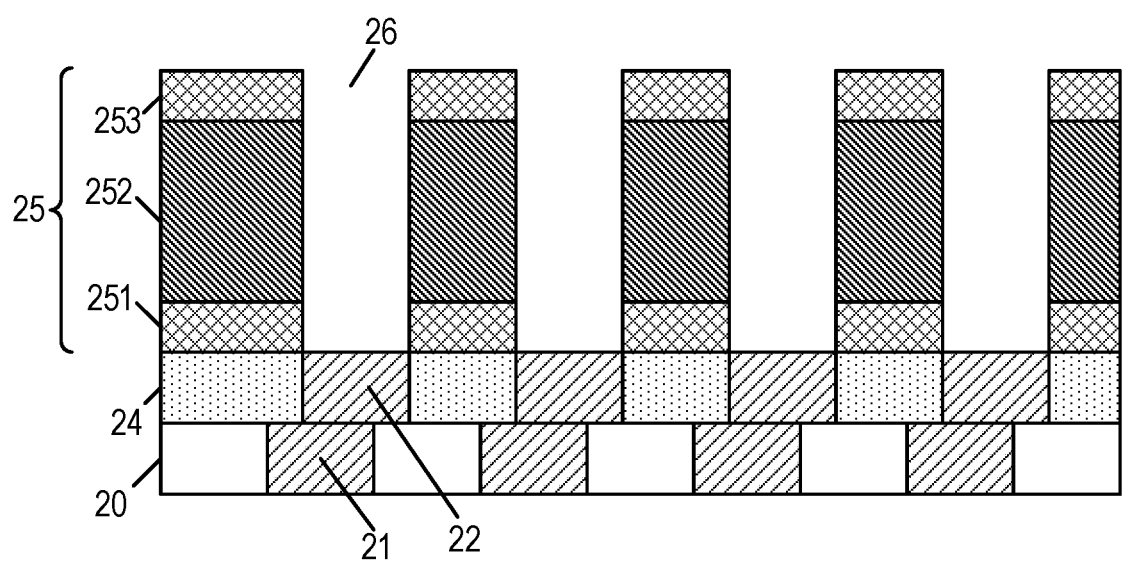
Figure 2G:
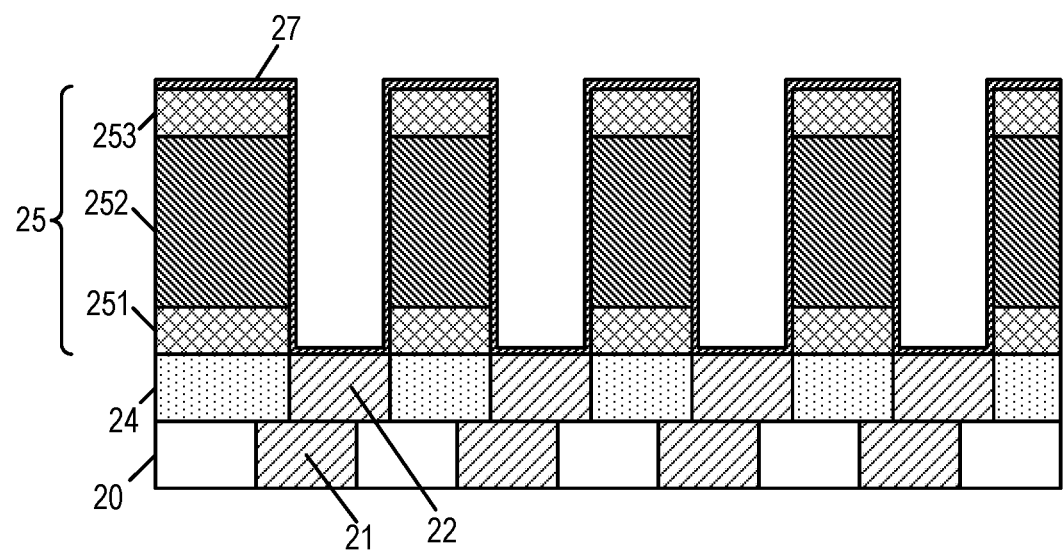
Figure 3:
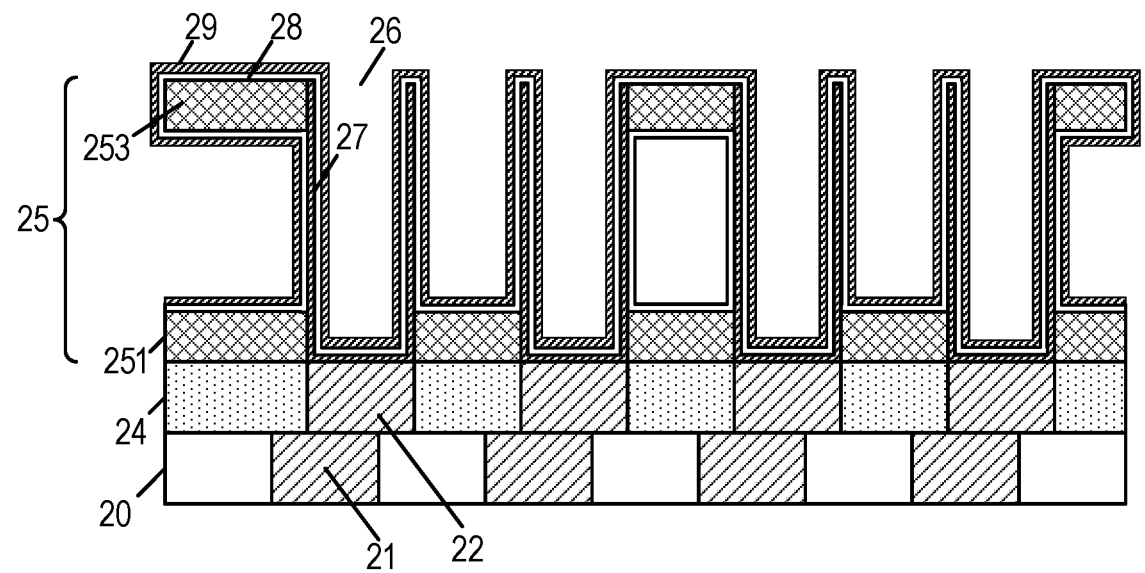
FIG. 3 is a diagram schematically illustrating the semiconductor structure in a specific embodiment of the present application.

A specific embodiment provides a semiconductor structure, FIG. 1 is a flowchart illustrating the method of forming a semiconductor substrate in a specific embodiment of the present application, FIGS. 2A-2G are cross-sectional views illustrating the main processing techniques in the process of forming a semiconductor structure in specific embodiments of the present application, and the semiconductor structure formed in this specific embodiment can be referred from FIG. 3. As shown in FIGS. 1, 2A-2G and 3, the method of forming a semiconductor structure provided by this specific embodiment comprises the following steps.

Step S11: forming a substrate 20, wherein a plurality of capacitive contacts 21 are provided in the substrate 20, a plurality of electrically conductive contact pads 22 are provided at a surface of the substrate 20 to be correspondingly connected to a plurality of capacitive contacts 21 on a one to one basis, and a space 23 is present between every two adjacent electrically conductive contact pads 22, as shown in FIG. 2A.

Specifically, the substrate 20 has therein a plurality of active regions arranged in an array, and the capacitive contacts 21 are located in the active regions. The material of the capacitive contacts 21 can be, but is not restricted to be, tungsten. A plurality of electrically conductive contact pads 22 are formed at the surface of the substrate 20, and each electrically conductive contact pad 22 is in direct contact with one capacitive contact 21 for electrically connecting the capacitive contact 21 with a capacitance column. The material of the electrically conductive contact pads 22 can be identical with the material of the capacitive contacts 21, both being tungsten for example. In this specific embodiment, the electrically conductive contact pad 22 is staggered by a certain distance relative to the capacitive contact 21 in contact therewith, so as to reduce the contact resistance between the electrically conductive contact pad 22 and the capacitive contact 21.

Step S12: forming a filling layer 24 that is fully filled in the space 23, as shown in FIG. 2C.

Optionally, the specific step of forming a filling layer 24 that is fully filled in the space 23 includes: forming a filling layer 24 that is fully filled in the space 23 and covers the surface of the electrically conductive contact pads 22, as shown in FIG. 2B; and removing the filling layer 24 that covers the surface of the electrically conductive contact pads 22 to expose the electrically conductive contact pads 22, as shown in FIG. 2C.

Optionally, the specific step of exposing the electrically conductive contact pads 22 includes: employing a chemical mechanical grinding process to remove the filling layer 24 that covers the surface of the electrically conductive contact pads 22, with the electrically conductive contact pads 22 serving as grind halting layers, to expose the electrically conductive contact pads 22.

Specifically, after the electrically conductive contact pads 22 are formed, a chemical vapor deposition process, a physical vapor deposition process, or an atomic layer deposition process is employed to grow one layer of filling layer 24, the filling layer 24 is fully filled in the space 23 and covers the electrically conductive contact pads 22, as shown in FIG. 2B. Thereafter, such a planarizing process as chemical mechanical grinding is employed to planarize the filling layer 24 with the electrically conductive contact pads 22 serving as grind halting layers, so that the top surface of the planarized filling layer 24 (namely the surface of the filling layer 24 facing away from the substrate 20) is flush with the top surface of the electrically conductive contact pads 22.

Step S13: forming a stacked structure 25 at the filling layer 24 and a surface of the electrically conductive contact pads 22, wherein the stacked structure 25 includes a plurality of supporting layers stacked one on another along a direction perpendicular to the substrate 20, the filling layer 24 is in contact with the one supporting layer disposed at a bottom of the stacked structure 25, and an etching selection ratio between the filling layer 24 and the supporting layer in contact therewith is greater than a preset value, as shown in FIG. 2E.

To facilitate subsequent selective etching, and to fully avoid over-etching of the filling layer 24, the preset value is optionally 3. It is further possible for persons skilled in the art to base on actual requirements to set the preset value as 5.

Optionally, the specific step of forming a stacked structure 25 at the filling layer 24 and a surface of the electrically conductive contact pads 22 includes: forming a first supporting layer 251 at the filling layer 24 and the surface of the electrically conductive contact pads 22, an etching selection ratio between the filling layer 24 and the first supporting layer 251 being greater than a preset value, as shown in FIG. 2D; forming a sacrificing layer 252 at a surface of the first supporting layer 251; and forming a second supporting layer 253 at a surface of the sacrificing layer 252.

Specifically, after the filling layer 24 is planarized, the first supporting layer 251 is deposited, so that the first supporting layer 251 covers the filling layer 24 and the electrically conductive contact pads 22; subsequently, the sacrificial layer 252 is deposited onto the surface of the first supporting layer 251; thereafter, the second supporting layer 253 is deposited onto the surface of the sacrificial layer 252. The material of the first supporting layer 251 can be identical with the material of the second supporting layer 253, both being a nitride material for example (silicon nitride, for instance). The material of the sacrificial layer 252 can be an oxide material (silica, for instance).

Description is made to this specific embodiment with the stacked structure 25 including two supporting layers and one sacrificial layer as an example, whereas in other specific embodiments, it is also possible for persons skilled in the art to base on actual requirements to provide a plurality of supporting layers and a plurality of sacrificial layers, both of which are alternatively arranged along a direction perpendicular to the substrate 20.

In order to further increase the etching selection ratio between the first supporting layer 251 and the filling layer 24, to thereby further avoid short circuit between upper electrode layer and lower electrode layer to be subsequently formed, optionally, the material of the first supporting layer 251 is SiN, and the material of the filling layer 24 is one of SiNCH and SiCN or a combination of the two.

Step S14: etching the stacked structure 25 to form a capacitance hole 26 that runs through the stacked structure 25 and exposes the electrically conductive contact pads 22, as shown in FIG. 2F.

Optionally, the specific step of forming a capacitance hole 26 that runs through the stacked structure 25 and exposes the electrically conductive contact pads 22 includes: etching the stacked structure 25, with the electrically conductive contact pads 22 and the filling layer 24 serving as halting layers, to form the capacitance hole 26 that runs through the stacked structure 25 and exposes the electrically conductive contact pads 22.

Specifically, after the stacked structure 25 is formed, a dry etching process can be employed to etch the stacked structure 25 along a direction perpendicular to the substrate 20 to form the capacitance hole 26 that runs through only the stacked structure 25 along a direction perpendicular to the substrate 20, on the bottom of the capacitance hole 26 are exposed the electrically conductive contact pads 22, as shown in FIG. 2F.

Since the filling layer 24 is formed between adjacent electrically conductive contact pads 22 in this specific embodiment, and since the etching selection ratio between the filling layer 24 and the supporting layer (the first supporting layer 251 for example) contacting therewith at the very bottom of the stacked structure 25 is relatively high, over-etching of the filling layer 24 can be avoided during the process of etching the stacked structure 25 and forming the capacitance hole 26, whereby is avoided forming holes in the filling layer 24, and the problem of short circuit between the upper electrode layer and the lower electrode layer in the capacitance column is essentially avoided.

Optionally, the following step is further included after forming a capacitance hole 26 that runs through the stacked structure 25 and exposes the electrically conductive contact pads 22: forming a capacitance column in the capacitance hole 26, wherein the capacitance column includes a lower electrode layer 27, a dielectric layer 28 and an upper electrode layer 29 stacked along a radial direction of the capacitance hole 26, and the lower electrode layer 27 is in contact with the electrically conductive contact pads 22.

Specifically, after the capacitance hole 26 is formed, a lower electrode material is deposited at the inner wall of the capacitance hole 26 and the top surface of the stacked structure 25 to form the lower electrode layer 27, as shown in FIG. 2G. Subsequently, the lower electrode layer 27 covering the top surface of the stacked structure 25 is removed, and partial third supporting layer 253 and the entire sacrificial layer 252 are removed via an etching process. Thereafter, a material having a high dielectric constant is deposited to form the dielectric layer 28 that covers the surface of the lower electrode layer 27, the surface of the third supporting layer 253 and the surface of the first supporting layer 251. Finally, an upper electrode material is deposited to form the upper electrode layer 29 that covers the surface of the dielectric layer 28, as shown in FIG. 3. The material of the lower electrode layer 27 can be identical with the material of the upper electrode layer 29, both being TiN for example.

Besides the above, the specific embodiment further provides a semiconductor structure. FIG. 3 is a diagram schematically illustrating the semiconductor structure in a specific embodiment of the present application. The semiconductor structure provided by this specific embodiment can be formed by the method shown in FIGS. 1 and 2A-2G. As shown in FIGS. 2A-2G and 3, the semiconductor structure comprises: a substrate 20, wherein a plurality of capacitive contacts 21 are provided in the substrate 20, and a plurality of electrically conductive contact pads 22 are provided at a surface of the substrate 20 to be correspondingly connected to a plurality of capacitive contacts 21 on a one to one basis; a filling layer 24, sandwiched between adjacent electrically conductive contact pads 22; a stacked structure 25, wherein the stacked structure 25 includes a plurality of supporting layers stacked one on another along a direction perpendicular to the substrate 20, the filling layer 24 is in contact with the one supporting layer disposed at a bottom of the stacked structure 25, and an etching selection ratio between the filling layer 24 and the supporting layer in contact therewith is greater than a preset value; and a capacitance hole 26, running through the stacked structure 25 and exposing the electrically conductive contact pads 22.

Optionally, the preset value is 3.

Optionally, the stacked structure 25 includes a first supporting layer 251 disposed at a surface of the filling layer 24 and a second supporting layer 253 disposed above the first supporting layer 251, and an etching selection ratio between the filling layer 24 and the first supporting layer 251 is greater than a preset value.

Optionally, the material of the first supporting layer 251 is SiN, and the material of the filling layer 24 is one of SiNCH and SiCN or a combination of the two.

Optionally, a top surface of the filling layer 24 is flush with a top surface of the electrically conductive contact pad 22.

Optionally, the electrically conductive contact pads 22 are disposed to be staggered relative to the capacitive contacts 21 correspondingly connected thereto.

Optionally, the semiconductor structure further comprises a capacitance column disposed in the capacitance hole 26, wherein the capacitance column includes a lower electrode layer 27, a dielectric layer 28 and an upper electrode layer 29 stacked along a radial direction of the capacitance hole 26, and the lower electrode layer 27 is in contact with the electrically conductive contact pads 22.

The semiconductor structure and its forming method provided by the specific embodiments avoid the problem of over-etching that tends to occur between adjacent capacitance contact pads during the process of etching the stacked structure to form the capacitance hole, hence avoid short circuit between the upper electrode and the lower electrode, realize improvement of electrical property of the memory, and enhance fabrication acceptance rate of the memory by providing a filling layer between adjacent electrically conductive contact pads, and by defining that the etching selection ratio between the filling layer and the supporting layer in contact therewith is greater than a preset value, without changing the dimension of the capacitance column.

What is described above is merely directed to preferred embodiments of the present application. As should be pointed out, persons ordinarily skilled in the art may make further improvements and modifications without departing from the principles of the present application, and all such improvements and modifications shall be regarded to fall within the protection scope of the present application.

What is claimed is:

1. A method of forming a semiconductor structure, comprising:
    forming a substrate, wherein a plurality of capacitive contacts are provided in the substrate, a plurality of electrically conductive contact pads are provided at a surface of the substrate to be correspondingly connected to a plurality of capacitive contacts on a one to one basis, and a space is present between every two adjacent electrically conductive contact pads;
    forming a filling layer that is fully filled in the space;
    forming a stacked structure at the filling layer and a surface of the electrically conductive contact pads, wherein the stacked structure includes a plurality of supporting layers stacked one on another along a direction perpendicular to the substrate, the filling layer is in contact with the one supporting layer disposed at a bottom of the stacked structure, and an etching selection ratio between the filling layer and the supporting layer in contact therewith is greater than a preset value; and
    etching the stacked structure to form a capacitance hole that runs through the stacked structure and exposes the electrically conductive contact pads.

2. The method of forming a semiconductor structure according to claim 1, wherein the specific step of forming a filling layer that is fully filled in the space includes:
    forming a filling layer that is fully filled in the space and covers the surface of the electrically conductive contact pads; and
    removing the filling layer that covers the surface of the electrically conductive contact pads to expose the electrically conductive contact pads.

3. The method of forming a semiconductor structure according to claim 1, wherein the specific step of exposing the electrically conductive contact pads includes:
 employing a chemical mechanical grinding process to remove the filling layer that covers the surface of the electrically conductive contact pads, with the electrically conductive contact pads serving as grind halting layers, to expose the electrically conductive contact pads.

4. The method of forming a semiconductor structure according to claim 1, wherein the specific step of forming a stacked structure at the filling layer and a surface of the electrically conductive contact pads includes:
 forming a first supporting layer at the filling layer and the surface of the electrically conductive contact pads, an etching selection ratio between the filling layer and the first supporting layer being greater than a preset value;
 forming a sacrificing layer at a surface of the first supporting layer; and
 forming a second supporting layer at a surface of the sacrificing layer.

5. The method of forming a semiconductor structure according to claim 4, wherein material of the first supporting layer is SiN, and material of the filling layer is one of SiNCH and SiCN or a combination of the two.

6. The method of forming a semiconductor structure according to claim 4, wherein the specific step of forming a capacitance hole that runs through the stacked structure and exposes the electrically conductive contact pads includes:
 etching the stacked structure, with the electrically conductive contact pads and the filling layer serving as halting layers, to form the capacitance hole that runs through the stacked structure and exposes the electrically conductive contact pads.

7. The method of forming a semiconductor structure according to claim 1, wherein the following step is further included after forming a capacitance hole that runs through the stacked structure and exposes the electrically conductive contact pads:
 forming a capacitance column in the capacitance hole, wherein the capacitance column includes a lower electrode layer, a dielectric layer and an upper electrode layer stacked along a radial direction of the capacitance hole, and the lower electrode layer is in contact with the electrically conductive contact pads.

8. The method of forming a semiconductor structure according to claim 1, wherein the preset value is 3.

9. A semiconductor structure, comprising:
 a substrate, wherein a plurality of capacitive contacts are provided in the substrate, and a plurality of electrically conductive contact pads are provided at a surface of the substrate to be correspondingly connected to a plurality of capacitive contacts on a one to one basis;
 a filling layer, sandwiched between adjacent electrically conductive contact pads;
 a stacked structure, wherein the stacked structure includes a plurality of supporting layers stacked one on another along a direction perpendicular to the substrate, the filling layer is in contact with the one supporting layer disposed at a bottom of the stacked structure, and an etching selection ratio between the filling layer and the supporting layer in contact therewith is greater than a preset value; and
 a capacitance hole, running through the stacked structure and exposing the electrically conductive contact pads.

10. The semiconductor structure according to claim 9, wherein the preset value is 3.

11. The semiconductor structure according to claim 9, wherein the stacked structure includes a first supporting layer disposed at a surface of the filling layer and a second supporting layer disposed above the first supporting layer, and an etching selection ratio between the filling layer and the first supporting layer is greater than a preset value.

12. The semiconductor structure according to claim 11, wherein material of the first supporting layer is SiN, and material of the filling layer is one of SiNCH and SiCN or a combination of the two.

13. The semiconductor structure according to claim 9, wherein a top surface of the filling layer is flush with a top surface of the electrically conductive contact pad.

14. The semiconductor structure according to claim 9, wherein the electrically conductive contact pads are disposed to be staggered relative to the capacitive contacts correspondingly connected thereto.

15. The semiconductor structure according to claim 9, further comprising a capacitance column disposed in the capacitance hole, wherein the capacitance column includes a lower electrode layer, a dielectric layer and an upper electrode layer stacked along a radial direction of the capacitance hole, and the lower electrode layer is in contact with the electrically conductive contact pads.

* * * * *